United States Patent
Ueda

(10) Patent No.: US 6,921,436 B2
(45) Date of Patent: Jul. 26, 2005

(54) SUBSTRATE PROCESSING APPARATUS AND SUBSTRATE PROCESSING METHOD

(75) Inventor: Yuji Ueda, Kikuchi-gun (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/290,351

(22) Filed: Nov. 8, 2002

(65) Prior Publication Data

US 2003/0091728 A1 May 15, 2003

(30) Foreign Application Priority Data

Nov. 12, 2001 (JP) .................................... 2001-345726

(51) Int. Cl.$^7$ ............................................. B05C 11/10
(52) U.S. Cl. ...................... 118/666; 118/689; 118/725; 118/58; 118/59; 118/62; 118/63
(58) Field of Search ................................ 118/666, 689, 118/725, 58, 59, 62, 63, 64; 134/902; 438/680, 773

(56) References Cited

U.S. PATENT DOCUMENTS

| | | |
|---|---|---|
| 5,919,520 A | 7/1999 | Tateyama et al. |
| 6,174,371 B1 * | 1/2001 | Iseki et al. .................. 118/689 |
| 6,248,168 B1 | 6/2001 | Takeshita et al. |
| 6,261,744 B1 | 7/2001 | Yoshioka |
| 6,306,778 B1 | 10/2001 | Sakai |
| 6,453,992 B1 * | 9/2002 | Kim ........................... 165/206 |

* cited by examiner

*Primary Examiner*—Chris Fiorilla
*Assistant Examiner*—George Koch
(74) *Attorney, Agent, or Firm*—Oblon, Spivak, McClelland, Maier & Neustadt, P.C.

(57) ABSTRACT

An aging unit (DAC) for processing a wafer W having a coated film formed thereon includes a disposing plate, a temperature control circulating device for controlling the temperature of the disposing plate, a chamber, a gas supply mechanism for supplying an ammonia gas containing a water vapor into the chamber, an input section for inputting the processing time of the wafer W, and a control device for controlling the temperature of the disposing plate, the supply rate of the ammonia gas, and the amount of the water vapor contained in the ammonia gas so as to permit the processing of the wafer W to be finished in the processing time inputted into the input section.

6 Claims, 9 Drawing Sheets

SUBSTRATE PROCESSING APPARATUS AND SUBSTRATE PROCESSING METHOD

BACKGROUND OF THE INVENTION

1. Field of the Invention

The present invention relates to a substrate processing apparatus and a substrate processing method used for forming a film such as an interlayer insulating film on a substrate such as a semiconductor wafer.

2. Description of the Related Art

In the manufacturing process of a semiconductor device, known as a method of forming a dielectric film such as an interlayer insulating film on a semiconductor wafer is a method of coating a wafer with a coating liquid by using an SOD (spin on dielectric) system so as to form a coated film, followed by applying a physical treatment such as a heat treatment to the coated film. In general, a spin coating method, in which a coating liquid is supplied onto substantially the center of a semiconductor wafer that is stopped or rotated, followed by rotating the semiconductor wafer at a prescribed rotating speed so as to expand the coating liquid onto the entire surface of the semiconductor wafer, is used as a method of forming a coated film.

Recently, a material having a low dielectric constant is required for forming an interlayer insulating film and, thus, various materials, which are so-called "low-k" materials, are being developed. Some of these low-k materials are required to be processed with an ammonia ($NH_3$) gas containing a prescribed amount of a water vapor.

FIG. 1 is a cross sectional view showing a conventional aging unit 90, which is used as a process unit for processing a wafer under an ammonia gas containing a water vapor. As shown in FIG. 1, the aging unit 90 comprises a disposing plate 91 on which a wafer W is disposed and a chamber 92 housing the disposing plate 91 consisting of a lower container 92a and a lid 92b. A gas supply port 95a for supplying an ammonia gas containing a water vapor ($NH_3/H_2O$) into the chamber 92 is formed in the bottom portion of the lower container 92a. On the other hand, an exhaust port 95b for exhausting the ammonia gas containing a water vapor and introduced into the chamber 92 is formed in the central portion of the lid 92b.

A bubbler, in which an ammonia gas is blown into an ammonia water stored in a tank for bubbling the ammonia water, is used in general as an apparatus for supplying an ammonia gas containing a water vapor into the aging unit 90. The ammonia water within the bubbler is maintained at a constant temperature.

However, the temperature of the disposing plate 91 is not controlled in the conventional aging unit 90. Therefore, the processing temperature of the wafer W within the aging unit 90 is greatly affected by the environment of the installing site of the aging unit 90. In this case, it is necessary to change the processing time in the aging unit 90 in order to maintain constant the degree of progress in the reaction of the coated film. For example, it is necessary to conduct the operation to determine the conditions for determining the processing time in accordance with the processing environment at a frequency of once a day. It is also necessary to change the tact time by changing the determined processing time. Further, if the processing time in the aging unit 90, which is obtained by the operation to determine the conditions, is long, e.g., 5 minutes, a problem is generated that the through-put of the wafer processing in the SOD system is lowered.

BRIEF SUMMARY OF THE INVENTION

An object of the present invention is to provide a substrate processing apparatus and a substrate processing method, which permit making constant the time for applying a prescribed processing to a coated film.

According to a first aspect of the present invention, there is provide a substrate processing apparatus for processing a substrate which has a coated film formed by the coating of a coating liquid with a prescribed process gas, comprising:

a disposing plate on which said substrate is disposed;

a plate temperature control mechanism for controlling the temperature of said disposing plate;

a chamber for housing said disposing plate;

a gas supply mechanism for supplying a process gas consisting of an ammonia gas containing a water vapor into said chamber;

an input section for inputting the processing time of said substrate with said process gas; and a control mechanism for controlling the temperature of said disposing plate, the supply rate of said ammonia gas, and the amount of the water vapor contained in said ammonia gas so as to permit the processing of said substrate to be finished in the processing time inputted into said input section.

According to a second aspect of the present invention, there is provided a substrate processing method for processing a substrate which has a coated film formed by the coating of a coating liquid in a predetermined processing time, comprising the steps of:

disposing said substrate on a disposing plate;

housing said disposing plate having said substrate disposed thereon in a chamber; and supplying an ammonia gas containing a prescribed amount of a water vapor into said chamber, wherein the temperature of said disposing plate, the supply rate of said ammonia gas into said chamber, or the amount of the water vapor contained in said ammonia gas is controlled so as to permit the processing in said ammonia gas supplying step to be finished in said predetermined processing time.

According to the substrate processing apparatus and the substrate processing method described above, it is possible to maintain constant the processing time of the substrate having a coated film formed thereon under an ammonia gas. As a result, it is possible to set short the waiting time of the substrate until the next processing so as to improve the through-put.

Further, in the case of changing the processing time, it is possible to determine easily the other process conditions such as the processing temperature of the substrate. On the other hand, in the case of changing of the tact time of a series of processing of the substrate including the processing under an ammonia gas, it is possible to quickly cope with the change by the processing conditions of the substrate under an ammonia gas. Still further, since it is possible to maintain constant the processed state of the coated film formed on the substrate, it is possible to maintain constant the quality of the substrate.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detail description of the preferred embodiments given below, serve to explain the principles of the invention.

DETAILED DESCRIPTION OF THE INVENTION

The present invention will now be described in detail with reference to the accompanying drawings. First of all, the description covers the case where an interlayer insulating film is formed on a semiconductor wafer by applying the technical idea of the present invention to an aging unit (DAC) having an SOD system mounted thereto.

Figure 1:
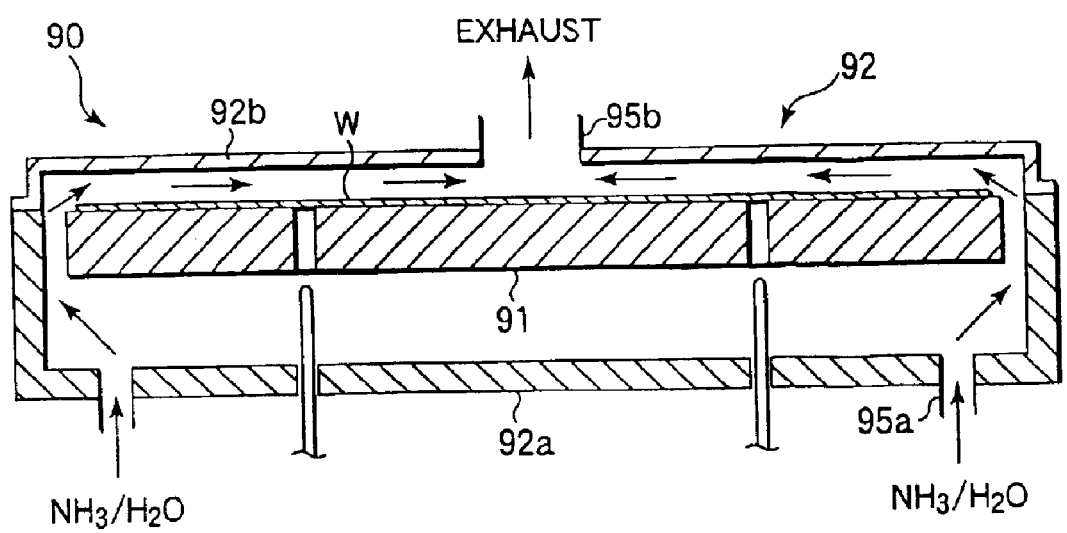
FIG. 1 is a cross sectional view schematically showing the construction of a conventional aging unit.
Figure 2:
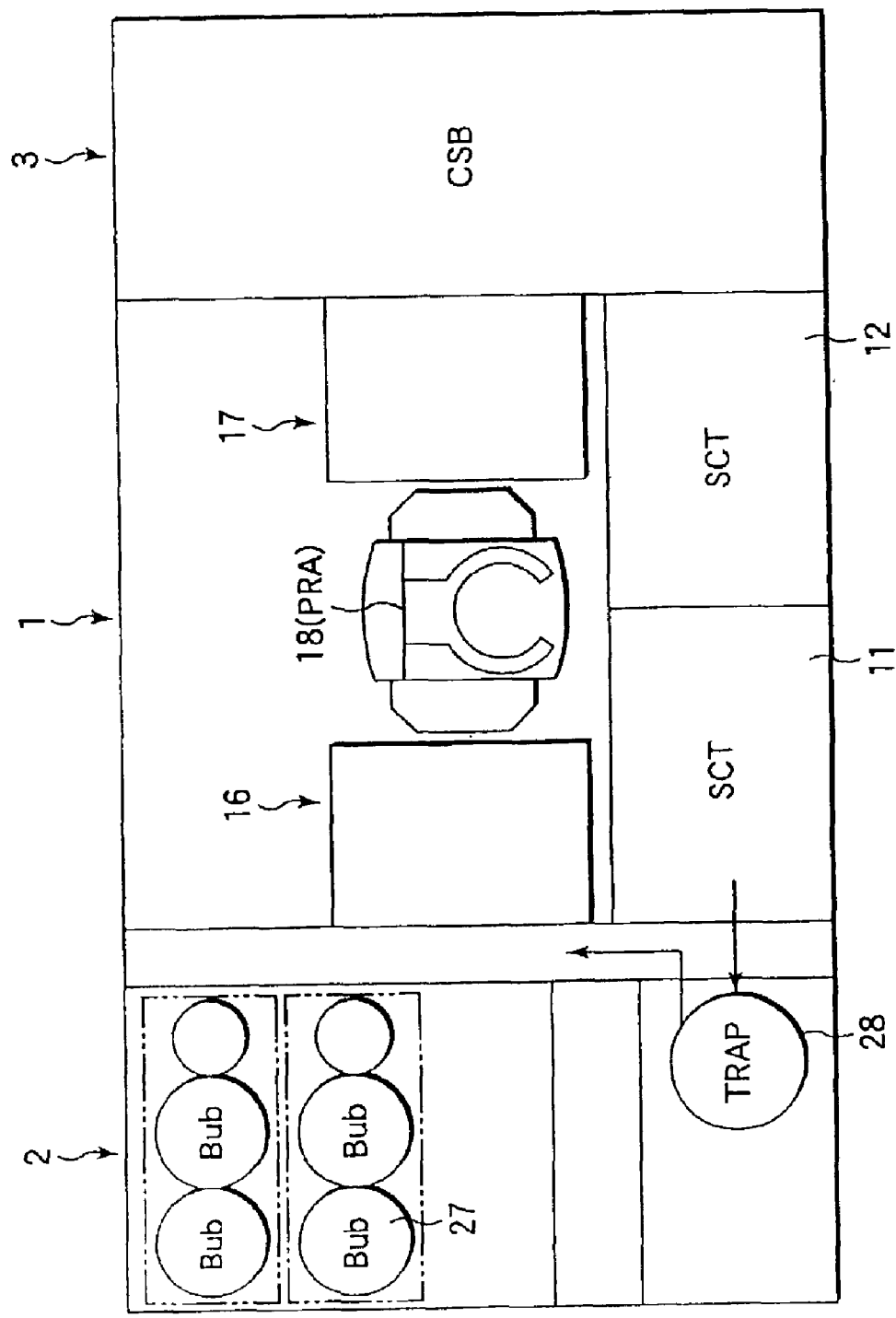
FIG. 2 is a plan view schematically showing the construction of an SOD system.
Figure 3:
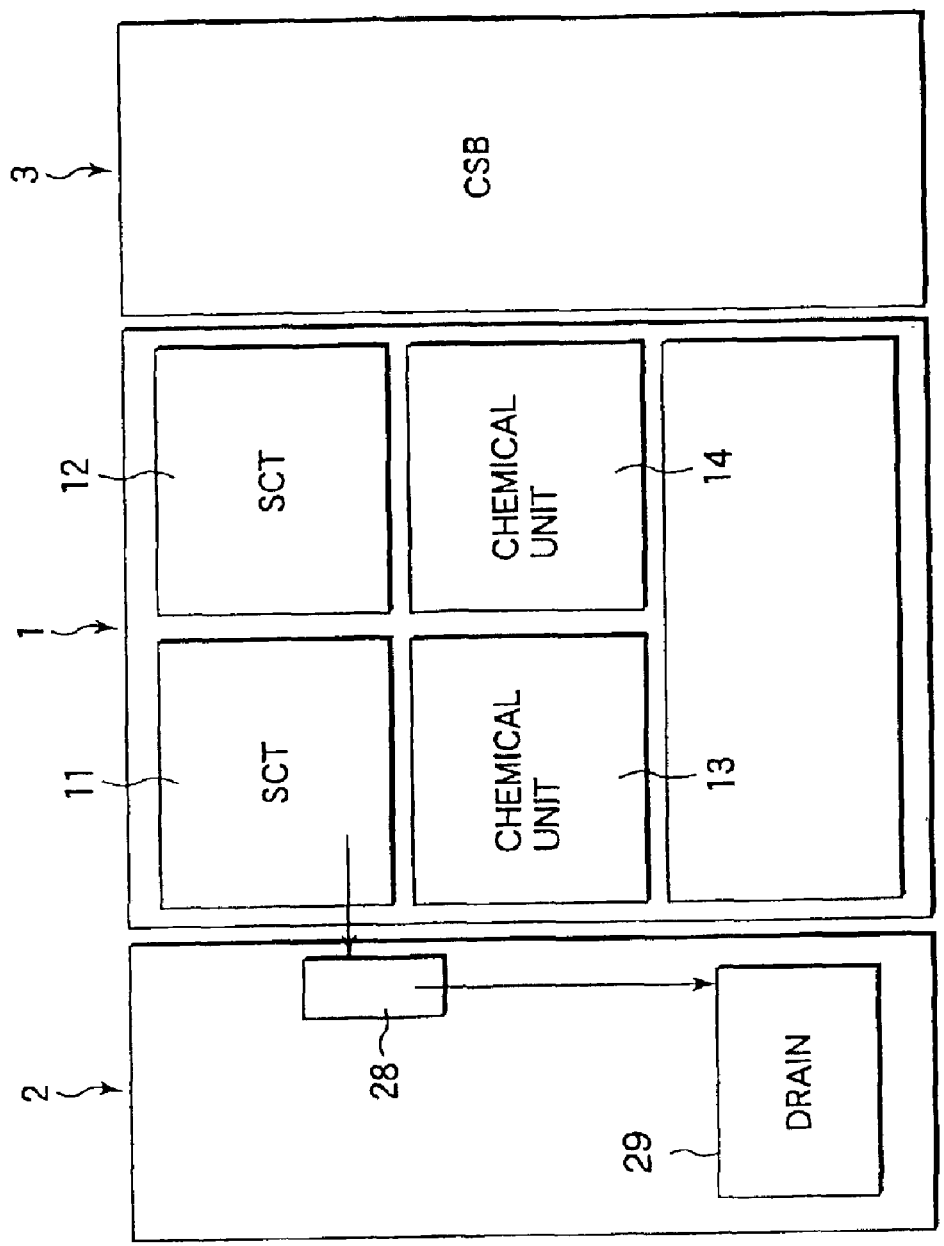
FIG. 3 is a side view showing the SOD system shown in FIG. 2.
Figure 4:
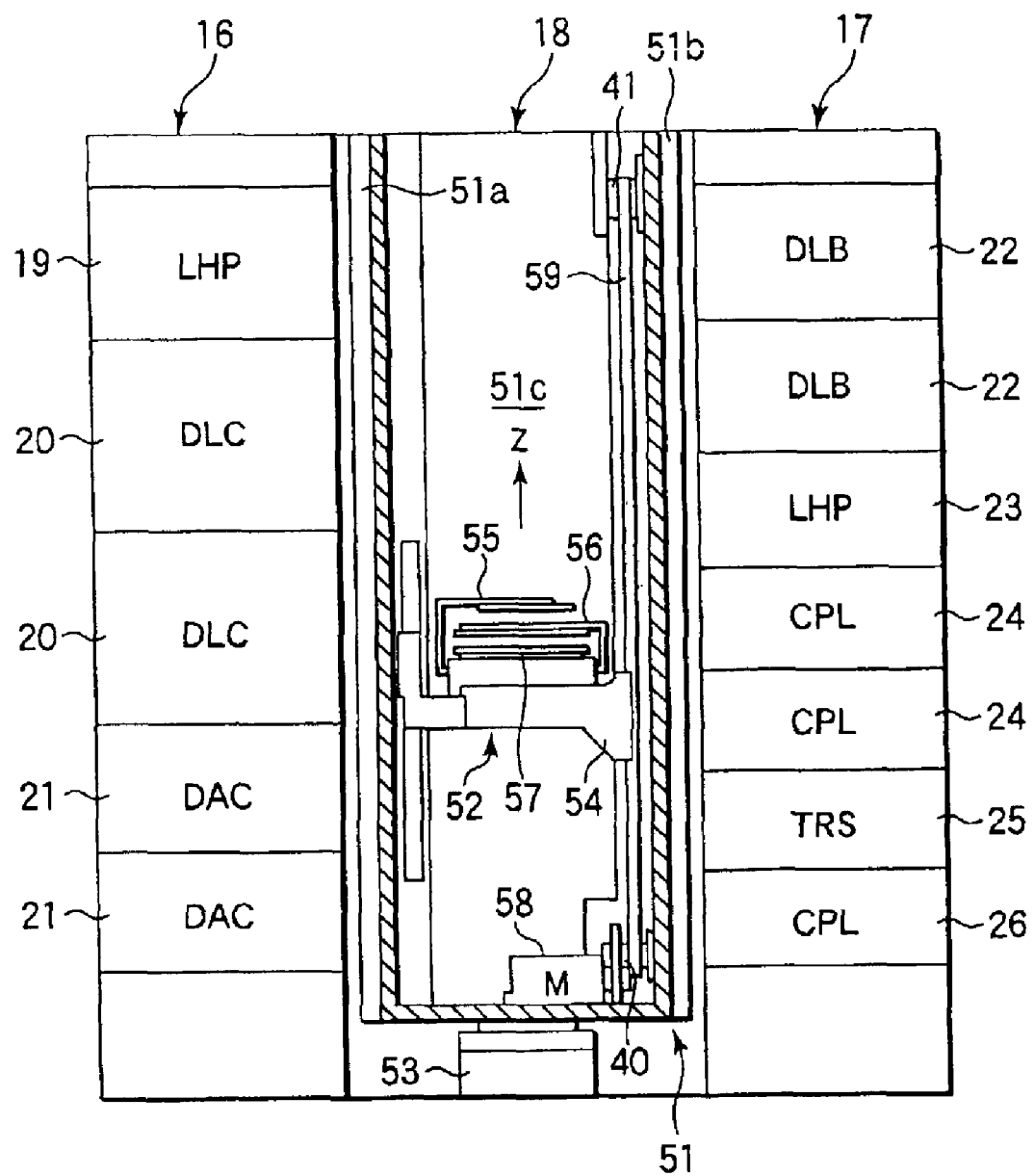
FIG. 4 is another side view showing the SOD system shown in FIG. 2.

FIG. 2 is a plan view showing the construction of the SOD system referred to above, FIG. 3 is a side view of the SOD system shown in FIG. 2, and FIG. 4 is a side view of a group of process units mounted within the SOD system shown in FIG. 2.

As shown in the drawings, the SOD system comprises a process section 1, a side cabinet 2 and a carrier station (CSB) 3. As shown in FIGS. 2 and 3, coating process units (SCT) 11, 12 are arranged in the upper portion on the front side (lower portion in FIG. 2) of the process section 1. Also, chemical units 13, 14 housing a coating liquid (chemical liquid) used in the coating process units (SCT) 11, 12 and a pump for transferring the coating liquid, etc. are arranged below the coating process units 11, 12, respectively.

As shown in FIGS. 2 and 4, process unit groups 16, 17 each consisting of a plurality of process units that are stacked one upon the other are arranged in the central portion of the process section 1, and a wafer transfer mechanism (PRA) 18 that is moved up and down for transferring the semiconductor wafers W is arranged between the process units groups 16 and 17.

The wafer transfer mechanism (PRA) 18 comprises a cylindrical support body 51 extending in the Z-direction and including vertical walls 51a, 51b, and a side open portion 51c positioned between these vertical walls 51a and 51b, and a wafer transfer body 52 arranged inside the cylindrical support body 51 so as to be movable in the Z-direction along the cylindrical support body 51. The cylindrical support body 51 can be rotated by a motor 53, and the wafer transfer body 52 can be integrally rotated in accordance with rotation of the cylindrical support body 51.

The wafer transfer body 52 includes a transfer base 54 and three wafer transfer arms 55, 56, 57 each movable in the back and forth direction along the transfer base 54. Each of the wafer transfer arms 55, 56, 57 is sized to be capable of passing through the side open section 51c of the cylindrical support body 51. Each of these wafer transfer arms 55, 56 and 57 can be moved back and forth independently by a motor and a belt mechanism housed in the transfer base 54. The wafer transfer body 52 can be moved up and down by a belt 59 driven by a motor 58. Incidentally, a reference numeral 40 shown in FIG. 4 denotes a driving pulley, and a reference numeral 41 denotes a driven pulley.

The process unit group 16 on the left side includes a hot plate unit (LHP) 19 for a low temperature, two curing units (DLC) 20, and two aging units (DAC) 21, which are stacked one upon the other in the order mentioned as viewed from the upper side, as shown in FIG. 4. On the other hand, the process unit group 17 on the right side includes two baking units (DLB) 22, a hot plate unit (LHP) 23 for a low temperature, two cooling plate units (CPL) 24, a transfer unit (TRS) 25, and a cooling plate unit (CPL) 26, which are stacked one upon the other in the order mentioned as viewed from the upper side. It is possible to arrange a hot plate unit (OHP) for a high temperature in place of the baking process unit (DLB) 22.

The side cabinet 2 includes a bubbler (Bub) 27 and a trap (TRAP) 28 for cleaning the exhaust gas exhausted from each unit. Also, a power supply source (not shown), a chemical liquid chamber (not shown) for storing an adhesion promoter, a pure water, an ammonia gas ($NH_3$), etc., and a drain 29 for discharging the waste liquid of the process liquid used in the SOD system are arranged below the bubbler (Bub) 27.

In forming an interlayer insulating film on a wafer W by, for example, a sol-gel method by using the SOD system of the construction described above, the wafer W is transferred in general through the cooling plate unit (CPL) 24 or 26, the coating process unit (SCT) 11 or 12, the aging unit (DAC) 21, and the baking unit (DLB) 22 (or the hot plate unit (OHP) for a high temperature) in the order mentioned for applying prescribed processing to the wafer W. Incidentally, it is possible to apply a prescribed processing to the wafer W in the hot plate unit (LHP) 19 or 23 for a low temperature between the processing in the aging unit (DAC) 21 and the processing in the baking unit (DLB) 22 (or in the hot plate unit (OHP) for a high temperature).

Also, in the case of forming an interlayer insulating film on the wafer W by a silk method or a speed film method, the wafer W is transferred in general through the cooling plate unit (CPL) 24 or 26, the coating process unit (SCT) 12 (coating of an adhesion promoter), the hot plate unit (LHP) 19 or 23 for a low temperature, the coating process unit (SCT) 11 (coating of the chemical liquid for forming the interlayer insulating film), the hot plate unit (LHP) 19 or 23 for a low temperature, the baking unit (DLB) 22 (or the hot plate unit (OHP) for a high temperature) and the curing unit (DLC) 20 in the order mentioned for applying the prescribed processing to the wafer W.

Further, in the case of forming an interlayer insulating film on the wafer W by a fox method, the wafer W is transferred in general through the cooling plate unit (CPL) 24 or 26, the coating process unit (SCT) 11 or 12, the hot plate unit (LHP) 19 or 23 for a low temperature, the baking unit (DLB) 22 (or the hot plate unit (OHP) for a high temperature) and the curing unit (DLC) 20 in the order mentioned for applying the prescribed processing to the wafer W.

In the case of forming an interlayer insulating film by using a low-k material by the various methods described above, the wafer W is coated with a chemical liquid in the coating process unit (SCT) 11 (or 12) so as to form a coated film and, then, the wafer W is transferred into the aging unit (DAC) 21 for the prescribed processing. Further, the wafer W is transferred into the hot plate unit (LHP) 19 or 23 for a low temperature, into the baking unit (DLB) 22 (or the hot plat unit (OHP) for a high temperature) and, then, into the curing unit (DLC) 20 for application of the prescribed processing to the wafer W. Incidentally, the material of the interlayer insulating film formed by these various methods is not particularly limited. To be more specific, it is possible to use various materials such as an organic material, an inorganic material or a hybrid material for forming the interlayer insulating film.

Figure 5:
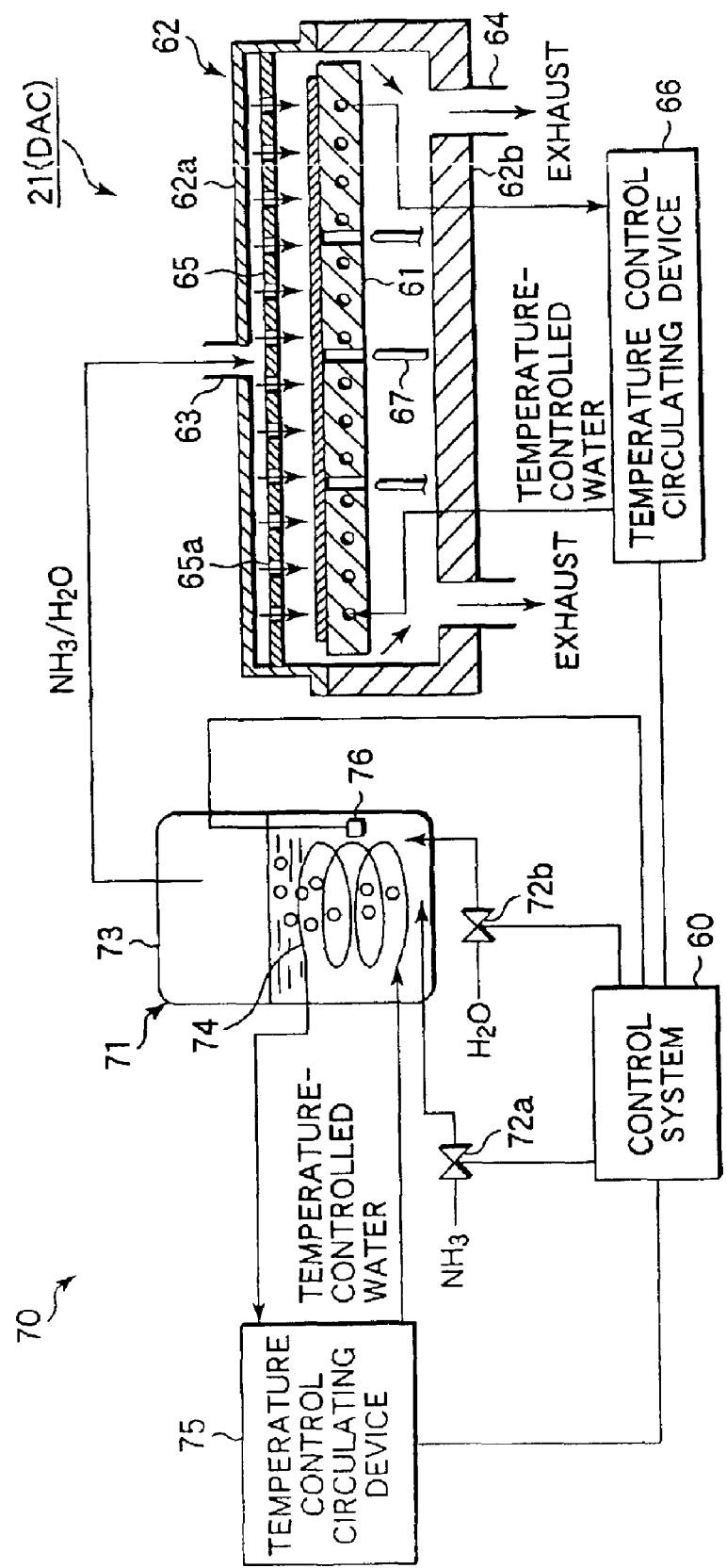
FIG. 5 is a cross sectional view showing the construction of an aging unit and the gas supply mechanism for supplying a prescribed gas into the aging unit.

FIG. 5 shows the construction of the aging unit (DAC) 21 and the construction of a gas supply mechanism 70 for supplying a gas having a prescribed composition into the aging unit (DAC) 21. The aging unit (DAC) 21 includes a disposing plate 61 on which the wafer W is disposed and a chamber 62 housing the disposing plate 61. On the other hand, the gas supply mechanism 70 includes a bubbler 71, pipe lines for supplying an ammonia gas and a pure water, respectively, into the bubbler 71, and another pipe line for supplying an ammonia gas containing a water vapor from the bubbler 71 into a gas inlet port 63. Further, the processing of the wafer W by the aging unit (DAC) 21 using the gas supply mechanism 70 is controlled by a control system 60.

Proximity pins (not shown) are arranged in a plurality of positions on the upper surface of the disposing plate 61 so as to permit the wafer W to be supported by these proximity pins while preventing the wafer W from being brought into a direct contact with the upper surface of the disposing plate 61. Also, the disposing plate 61 has a jacket structure such that water controlled at a prescribed temperature by a temperature control circulating device 66 is circulated within the disposing plate 61. As a result, the disposing plate 61 is maintained at a prescribed temperature so as to make it possible to maintain constant the temperature of the wafer W disposed on the disposing plate 61.

Incidentally, the temperature control circulating device 66 controls the temperature of the circulating water and circulates the temperature-controlled water. The temperature and the circulating rate of the circulating water controlled by the temperature control circulating device 66 are determined by instructions given from the control system 60.

The chamber 62 includes a lid 62*a* that can be moved in the vertical direction by a lift mechanism (not shown) and a lower container 62*b* capable of housing the disposing plate 61. The lower container 62*a* is fixed to a frame, etc. constituting an SOD system. Lift pins 67 extending through the disposing plate 61 so as to move the wafer W in the vertical direction are arranged in the lower container 62*b*. The wafer W is transferred between the lift pins 67 and the wafer transfer arms 55 to 57 under the state that the lid 62*a* is retreated upward and the upper edges of the lift pins 67 are moved upward to prescribed positions on the upper side of the disposing plate 61.

A gas inlet port 63 for introducing an ammonia gas containing a water vapor ($NH_3/H_2O$), which is supplied from the gas supply mechanism 70, into the chamber 62 is formed in the center of the upper wall of the lid 62*a*. Also, a diffusion plate 65 provided with gas passing ports 65*a* is mounted to the lid 62*a*. The gas passing ports 65*a* are formed appropriately so as to permit the ammonia gas containing a water vapor, which is supplied from the gas inlet port 63, to be supplied uniformly onto the wafer W in the form of a down flow stream. Since the ammonia gas containing a water vapor is supplied uniformly onto the wafer W in this fashion, it is possible to process uniformly the coated film formed on the surface of the wafer W.

The ammonia gas containing a water vapor, which is supplied onto the wafer W, passes through the clearance between the disposing plate 61 and the side wall of the lower container 62*b* so as to be exhausted to the outside through an exhaust port 64 formed in the bottom portion of the lower container 62*b*.

The bubbler 71 includes a tank 73 for storing an ammonia water, a temperature sensor 76 for measuring the temperature of the ammonia water stored in the tank 73, and a temperature control pipe 74 that permits a temperature-controlled water controlled at a prescribed temperature to be circulated within the tank 73 so as to control the ammonia water stored in the tank 73 at a desired temperature. The gas supply mechanism 70 is controlled by the control system 60 that also controls the temperature control circulating device 66.

An ammonia gas is supplied from an ammonia gas source (not shown) into the tank 73. The ammonia gas supplied into the tank 73 causes the ammonia water stored in the tank 73 to bubble so as to form an ammonia gas containing a prescribed amount of a water vapor. The ammonia gas containing a prescribed amount of a water vapor is discharged from the tank 73 so as to be sent to the gas inlet port 63 formed in the lid 62a. The supply rate of the ammonia gas is controlled by controlling the opening degree of a valve 72a, and the operation of the valve 72a is controlled by the control system 60.

A pure water is supplied from a pure water supply source (not shown) into the tank 73. The ammonia water stored in the tank 73 has a saturated ammonia concentration. Where the amount of the ammonia water within the tank 73 is made smaller than a prescribed amount, it is possible to supply a pure water into the tank 73 so as to increase the amount of the ammonia water and to further supply an ammonia gas into the tank 73 so as to increase the ammonia concentration of the thinned ammonia water to a saturated ammonia concentration. The supply rate of the pure water can be controlled by controlling the opening degree of a valve 72b, and the opening-closing operation of the valve 72b can be performed by the control system 60.

Incidentally, it is possible to arrange, for example, a water level sensor within the tank 73. In this case, the gas supply mechanism 70 is constructed such that, where the water level sensor has detected that the amount of the ammonia water within the tank 73 is decreased to a level lower than a prescribed level, the control system 60 permits opening the valve 72b so as to supply a prescribed amount of a pure water into the tank 73 and also permits opening the valve 72a so as to supply an ammonia gas into the tank 73, thereby allowing the ammonia water within the tank 73 to have a saturated ammonia concentration.

The control system 60 permits supplying a temperature-controlled water controlled at a prescribed temperature by the temperature control circulating device 75 into the temperature control pipe 74 while referring to the temperature detected by the temperature sensor 76 so as to permit the ammonia water stored in the tank 73 to be maintained at a set temperature. The temperature and the circulating rate of the temperature-controlled water controlled by the temperature control circulating device 75 are also determined by the instructions given from the control system 60. It is possible to change the amount of the water vapor contained in the ammonia gas by changing the temperature of the temperature-controlled water supplied into the temperature control pipe 74 so as to change the temperature of the ammonia water within the tank 73.

As described above, in the aging unit (DAC) 21, the disposing plate 61 on which the wafer W is disposed is controlled at a prescribed temperature, and the ammonia water stored in the tank 73 is also controlled at a prescribed temperature. As a result, it is possible to maintain constant the process conditions of the wafer W within the aging unit (DAC) 21. This implies that the processing time of the wafer W within the aging unit (DAC) 21 is maintained constant. If the particular situation is utilized reversely, it is possible to determine in advance the processing time within the aging unit (DAC) 21 at a desired time and to determine the conditions for processing the wafer W within the processing time thus determined without fail. Since it is possible to set short the waiting time of the wafer W until a processing next to the processing in the aging unit (DAC) 21 so as to improve the through-put.

Figure 6:
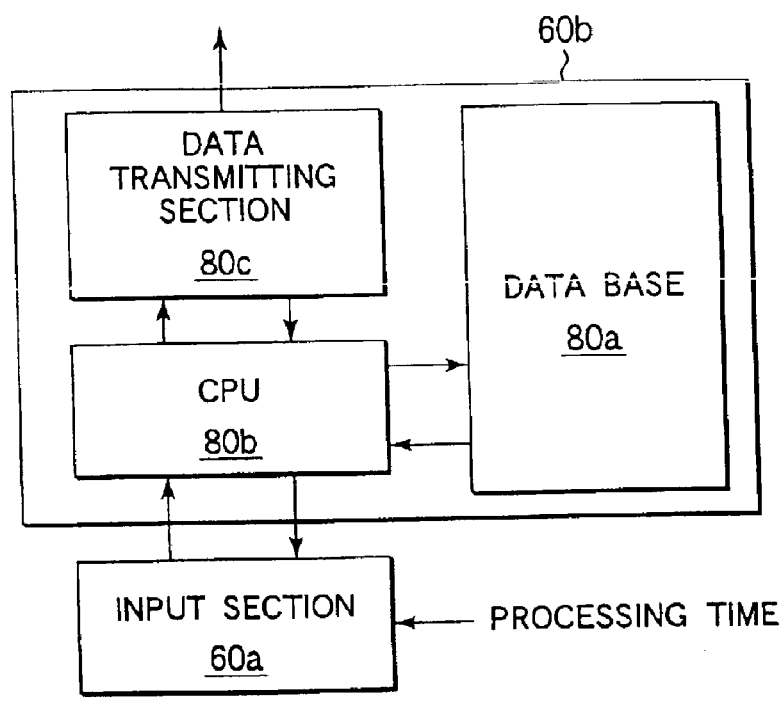
FIG. 6 is a block diagram showing the construction of a control system.

FIG. 6 is a block diagram showing the construction of the control system 60 used for determining the process conditions in the aging unit (DAC) 21. The process system 60 includes an input section 60a for inputting the processing time in the aging unit (DAC) 21 and a control device 60b for processing the data inputted into the input section 60a. The control device 60b includes a data base 80a, a CPU 80b, and a data transmitting section 80c. The operator of the SOD system inputs the processing time in the aging unit (DAC) 21 into the input section 60a. It should be noted that data denoting the relationship among three parameters and the processing time, said three parameters consisting of the temperature of the disposing plate 61, the supply rate of the ammonia gas containing a water vapor into the chamber 62, and the amount of the water vapor contained in the ammonia gas, is stored in the data base 80a.

Figure 7:
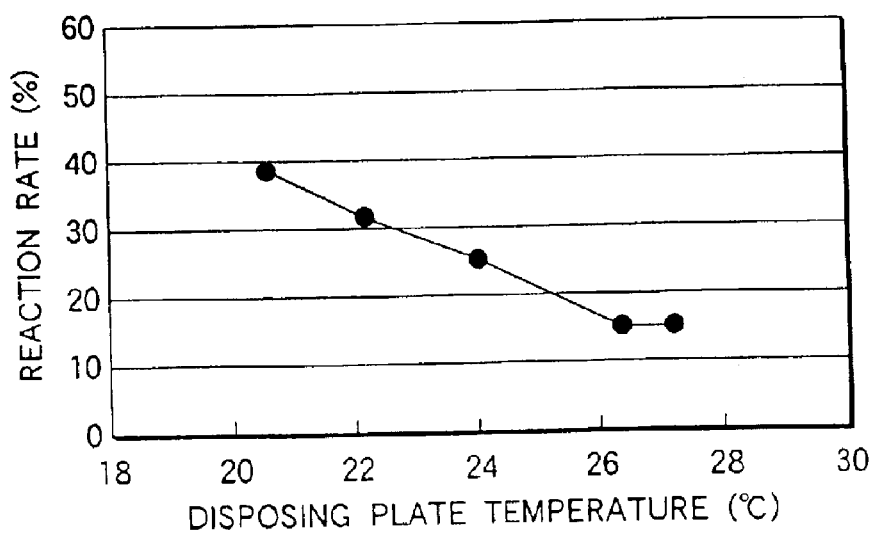
FIG. 7 is a graph showing the relationship between the degree of progress in the reaction of the coated film and the temperature of the disposing plate.

Stored in the data base 80a is, for example, the data denoting the relationship between the degree of progress in the reaction of the coated film and the temperature of the disposing plate 61 in the case where the processing time in the aging unit (DAC) 21 is set at 60 seconds, as shown in FIG. 7. Similarly, stored in the data base 80a are the data denoting the relationship between the degree of progress in the reaction of the coated film and the temperature of the disposing plate 61 under another processing time, the data denoting the degree of progress in the reaction of the coated film and the flow rate of the ammonia gas containing a water vapor in the case where the temperature of the disposing plate 61 is maintained constant, and the data denoting the relationship between the degree of progress in the reaction of the coated film and the amount of the water vapor contained in the ammonia gas in the case where the temperature of the disposing plate 61 is maintained constant.

The CPU 80b calculates the conditions under which the processing can be performed within the inputted processing time, i.e., the temperature of the disposing plate 61, the supply amount of the ammonia gas, and the amount of the water vapor contained in the ammonia gas, with reference to the data stored in the data base 80a. The condition calculated by the CPU 80b is not limited to a single condition, and it is possible for the operator to select a single condition from among a plurality of calculated conditions. The data transmitting section 80c transmits the data calculated in the CPU 80b or the data of the process conditions determined by the operator to the temperature control circulating devices 66, 75 and the valves 72a, 72b.

Incidentally, where the temperature of the disposing plate 61, the supply amount of the ammonia gas containing a water, and the amount of the water vapor contained in the ammonia gas have been determined as a result of the calculation by the CPU 80b, it is possible to change the conditions partly. For example, the result of the calculation by the CPU 80b is displayed on a screen by designating the processing time in the aging unit (DAC) 21. If the result of temperature of the disposing plate 61 is 26° C., an operator can change the temperature of the disposing plate 61 to 22° C. by such an operation as touching the screen. Then, the CPU 80b calculates the new process condition by the data inputted by the operator without changing the processing time in the aging unit (DAC) 21. By this way, the final process condition is determined.

On the other hand, it is possible to quickly cope with the change of tact time of a series of processing in the SOD system by changing the processing time in the aging unit (DAC) 21.

Figure 8:
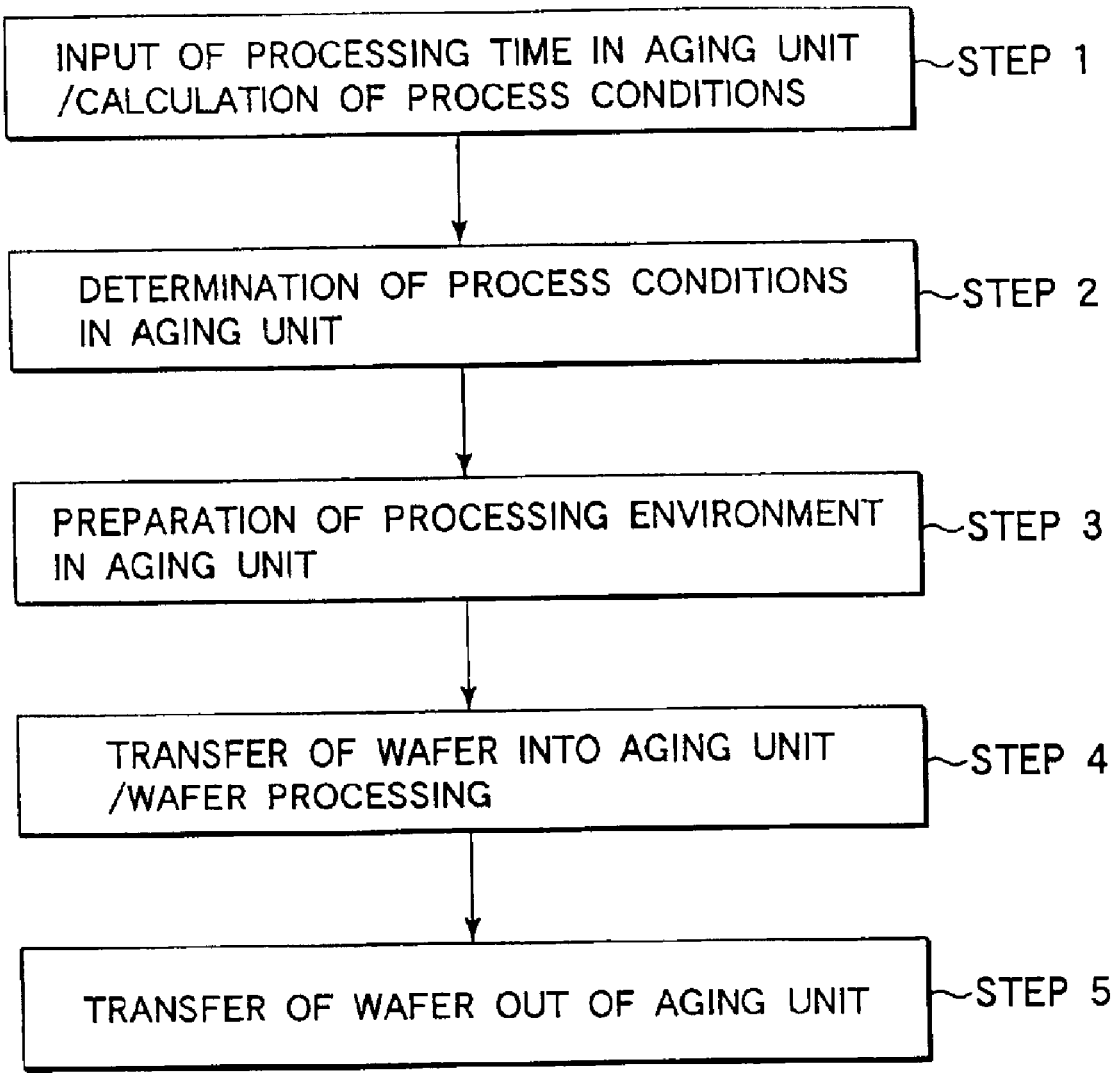
FIG. 8 is a flow chart exemplifying the process steps of a wafer using an aging unit.

FIG. 8 is a flow chart exemplifying the process steps of the wafer W using the aging unit (DAC) 21 of the construction described above. As shown in FIG. 8, the operator inputs first the processing time, for example, 60 seconds, in the aging unit (DAC) 21 into the input section 60a so as to allow the control device 60b to determine the process conditions in the aging unit (DAC) 21 (step 1). Since it is possible to set the processing time optionally in this fashion, it is possible for the operator to perform easily the processing in the case where it is necessary to change the tact time of the aging unit (DAC) 21 in view of the relationship with the other units.

The operator selects the process conditions as required so as to determine the process conditions such as the temperature of the disposing plate 61, the supply rate of the ammonia gas, and the temperature at which th ammonia water is held, i.e., the amount of the water vapor contained in the ammonia gas (step 2). After the process conditions in the aging unit (DAC) 21 are determined in this fashion, a control signal is transmitted from the control device 60b to the temperature control circulating device 66 and 75, etc. so as to set up the required process environment in the aging unit (DAC) 21 (step 3). It follows that the conventional step of determining the process conditions is not required in the aging unit (DAC) 21.

In the next step, the wafer W having a coated film formed thereon by the coating with a coating liquid for forming an interlayer insulating film in the coating process unit (SCT) 11 or 12 is housed in the chamber 62 of the aging unit (DAC) 21, and a prescribed flow rate of an ammonia gas containing a prescribed amount of a water vapor is supplied into the chamber 62 so as to process the wafer W (step 4). Since the processing time in the aging unit (DAC) 21 is constant, it is possible to set short the waiting time of the wafer W until the next processing so as to improve the through-put in the SOD system.

After a prescribed processing time, the supply of an ammonia gas containing a water vapor is stopped, and the wafer W is taken out of the chamber 62 (step 5). Then, the wafer W is transferred into the baking unit (DLB) 22 so as to apply a prescribed heat treatment to the wafer W. The water W is further transferred into the curing unit (DLC) 20 or a furnace (FNC) (not shown) positioned adjacent to the SOD system for application of a heat treatment to the wafer W, thereby forming an interlayer insulating film on the wafer W.

The description given above covers the case where the bubbler 71 is used for supplying an ammonia gas containing a water vapor into the aging unit (DAC) 21. However, the method of supplying a water vapor and an ammonia gas into the aging unit (DAC) 21 is not limited to the method using the bubbler 71.

Figure 9:
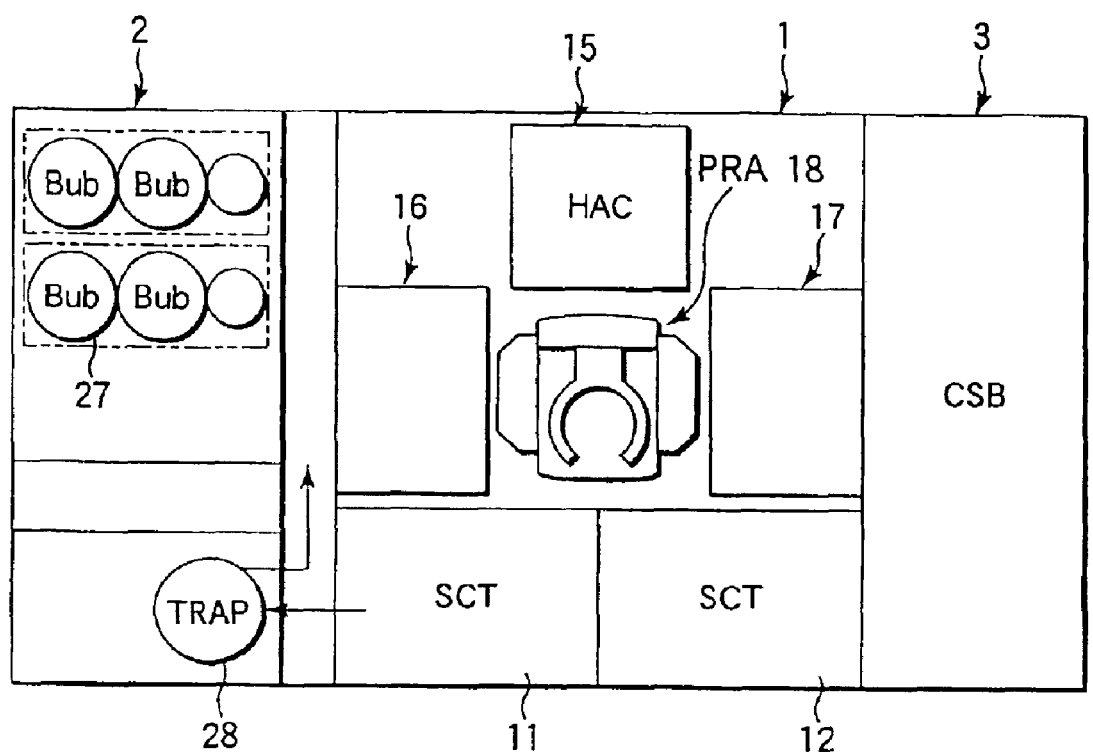
FIG. 9 is a plan view schematically showing the construction an SOD system equipped with a humidifying-heat treating unit.
Figure 10:
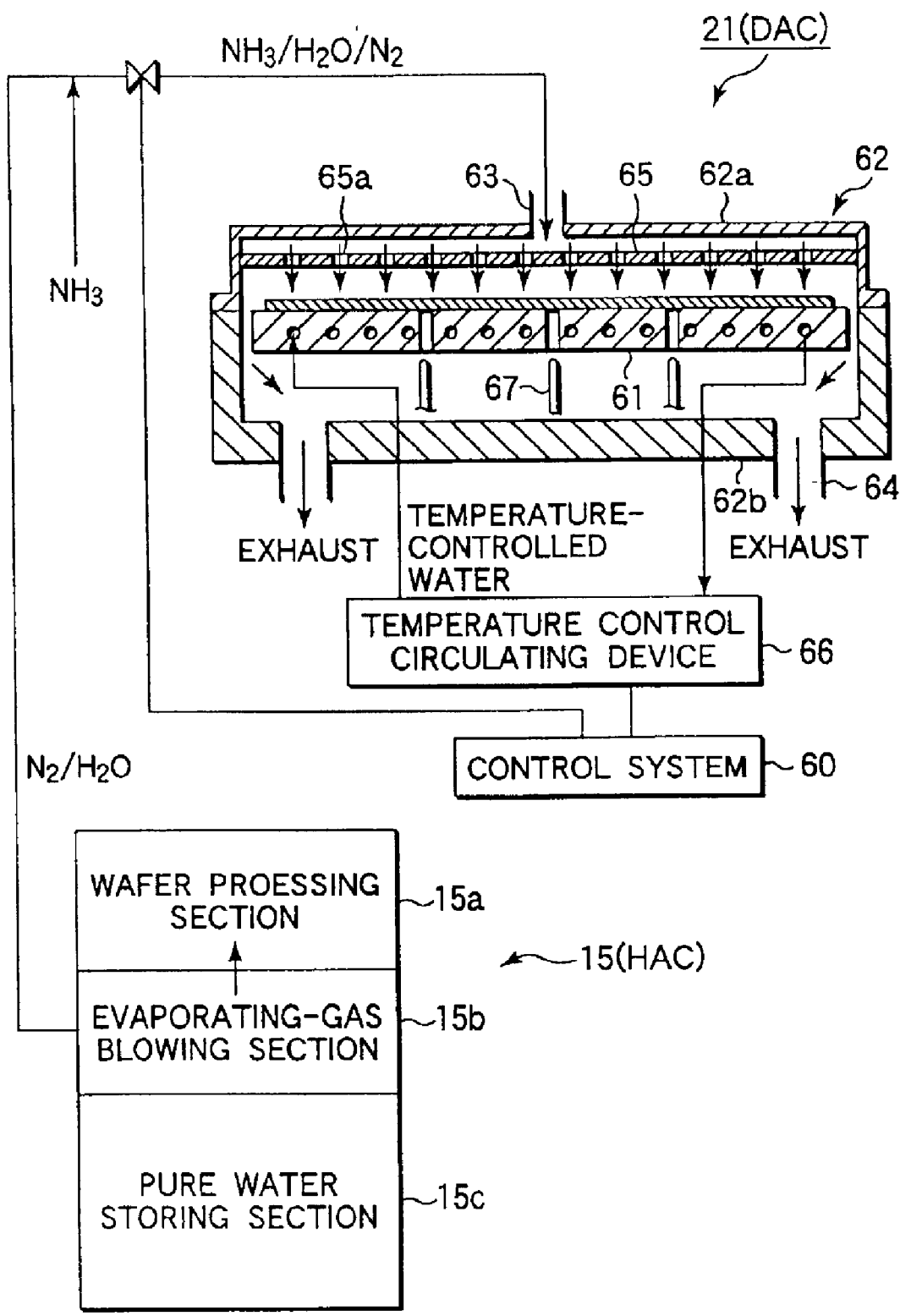
FIG. 10 schematically shows the construction of a humidifying-heat treating unit and exemplifies the gas supply method from the humidifying-heat treating unit into an aging unit.

For example, some of the low-k materials makes it necessary to subject a coated film formed by coating the wafer with a coating liquid to a heat treatment while supplying a gas containing a prescribed amount of a water vapor. FIG. 9 is a plan view schematically showing the construction of the SOD system provided with a humidifying heat treating unit (HAC) 15 for applying a heat treatment to the wafer W under a gaseous atmosphere containing a water vapor, and FIG. 10 schematically shows the construction of the humidifying heat treating unit (HAC) 15 and exemplifies a gas supply method from the humidifying heat treating unit (HAC) to the aging unit (DAC) 21.

In the SOD system shown in FIG. 9, the humidifying heat treating unit (HAC) 15 is arranged behind the wafer transfer mechanism (PRA) 18 included in the SOD system shown in FIG. 2. The humidifying heat treating unit (HAC) 15 includes a pure water storing section 15c formed in the lower stage, a wafer processing section 15a formed in the upper stage for subjecting the wafer W to a heat treatment under a humidified atmosphere, and an evaporating-gas blowing section 15b formed in the middle stage for evaporating the pure water stored in the pure water storing section 15c and mixing the evaporated water with a nitrogen gas so as to prepare a nitrogen gas controlled at a prescribed humidity (humidified gas) and for blowing the humidified gas into the wafer processing section 15a.

An ammonia gas is supplied from an ammonia source (not shown) into the chamber 62 included in the aging unit (DAC) 21. Also, the humidified gas is supplied from the evaporating-gas blowing section 15b included in the humidifying heat treating unit (HAC) 15 into the chamber 62 of the aging unit (DAC) 21. It is desirable for the ammonia gas and the humidified gas to be mixed with each other to form a uniform gas before these gases are supplied into the gas inlet port 63. In this case, it is possible to process the wafer W under an ammonia gas atmosphere containing a water vapor in the aging unit (DAC) 21 without using the bubbler 71. The data concerning the process conditions of the wafer W in the case of using a mixed gas containing a water vapor, an ammonia gas and a nitrogen gas is stored in the control system 60 of the aging unit (DAC) 21, and it suffices to determine the process conditions based on the data stored in the control system 60 noted above.

Incidentally, a nitrogen gas is supplied into the chamber 62. However, the coated film is not adversely affected at all by the nitrogen gas. Also, it is possible to arrange a pipe line for supplying an ammonia gas into the evaporating-gas blowing section 15b for allowing the ammonia gas to contain a water vapor separately from the pipe line for allowing a nitrogen gas to contain a water vapor.

The present invention is not limited to the embodiment described above. For example, the embodiment described above covers the case where an ammonia gas containing a water vapor is used as a process gas. Alternatively, it is also possible to apply the technical idea of the present invention to an apparatus for processing a substrate by using as a process gas an ammonia gas containing a vapor of an organic solvent or a gaseous material other than the ammonia gas, said gaseous material containing a water vapor.

It should be noted that the embodiments described above are simply intended to clarify the technical idea of the present invention. Naturally, the technical scope of the present invention should not be construed solely on the basis of the specific embodiment described above. In other words, the present invention can be worked in variously modified fashions on the basis of the spirit of the present invention and within the scope defined in the accompanying claims.

What is claimed is:

1. A substrate processing apparatus for processing a substrate which has a coated film, comprising:

a disposing plate on which the substrate is disposed;

a plate temperature control mechanism for controlling a temperature of the disposing plate;

a chamber for housing the disposing plate;

a gas supply mechanism for supplying a process gas consisting of an ammonia gas containing a water vapor into the chamber;

an input section for inputting a processing time of the substrate with the process gas;

a data base in which data denoting a relationship between each of a plurality of parameters and the processing time, the plurality of parameters consisting of the temperature of the disposing plate, a supply rate of the ammonia gas, and an amount of the water vapor contained in the ammonia gas, is stored; and a control mechanism for determining, on the basis of the data stored in the data base, the temperature of the disposing plate, the supply rate of the ammonia gas, and the amount of the water vapor contained in the ammonia corresponding to the processing time inputted into the input section.

2. The substrate processing apparatus according to claim 1, wherein the control mechanism includes:

an arithmetic section for calculating with reference to the data base the conditions allowing the processing of the substrate to be finished in the processing time; and a data transmitting section for transmitting the data calculated in the arithmetic section to the plate temperature control mechanism and the gas supply mechanism.

3. The substrate processing apparatus according to claim 2, wherein at least one parameter of the temperature of the disposing plate, the supply rate of the ammonia gas, and the amount of the water vapor contained in the ammonia can be changed, and the arithmetic section recalculates other parameters based on the changed parameter and the data stored in the data base.

4. The substrate processing apparatus according to claim 2, wherein:

the arithmetic section calculates a plurality of process conditions which is a combinations of the temperature of the disposing plate, the supply rate of the ammonia gas, and the amount of the water vapor contained in the ammonia; and one process condition from the plurality of process conditions is determined by an operator by using the input section.

5. The substrate processing apparatus according to claim 1, wherein:

the chamber includes a lower container housing the disposing plate, and a lid closing the upper opening of the lower container;

the lid includes a gas inlet port for introducing the gas supplied from the supply mechanism into the chamber, and a diffusion plate held substantially horizontal and having gas passing ports formed at prescribed positions so as to permit the gas introduced through the gas inlet port into the chamber to be blown against the substrate disposed on the disposing plate in the form of a substantially uniform down flow; and the lower container includes an exhaust port formed at the bottom portion for exhausting the gas introduced through the gas inlet port into the chamber to the outside of the chamber.

6. The substrate processing apparatus according to claim 1, wherein the gas supply mechanism includes:

a bubbler for storing an ammonia water having a prescribed concentration, the ammonia water being caused to bubble by the ammonia gas; and a bubbler temperature control mechanism for controlling the temperature of the ammonia water stored in the bubbler.

* * * * *